(12) United States Patent  
Anderson et al.

(10) Patent No.: US 7,045,862 B2  
(45) Date of Patent: May 16, 2006

(54) METHOD AND STRUCTURE FOR PROVIDING TUNED LEAKAGE CURRENT IN CMOS INTEGRATED CIRCUIT

(75) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/710,006

(22) Filed: Jun. 11, 2004

(65) Prior Publication Data

US 2005/0275015 A1    Dec. 15, 2005

(51) Int. Cl.  
*H01L 27/12* (2006.01)

(52) U.S. Cl. .................. 257/347; 257/350; 257/351; 438/149; 438/153; 438/154

(58) Field of Classification Search .............. 257/338  
See application file for complete search history.

(56) References Cited

U.S. PATENT DOCUMENTS

| | | | |
|---|---|---|---|
| 3,328,210 A * | 6/1967 | McCaldin et al. | .......... 438/288 |
| 4,827,324 A | 5/1989 | Blanchard | |
| 5,264,380 A | 11/1993 | Pfiester | |
| 5,321,283 A | 6/1994 | Cogan et al. | |
| 6,509,233 B1 | 1/2003 | Chang et al. | |
| 2002/0123196 A1 | 9/2002 | Chang et al. | |
| 2004/0195628 A1 * | 10/2004 | Wu et al. | .................... 257/351 |
| 2005/0020020 A1 * | 1/2005 | Collaert et al. | ............. 438/300 |

* cited by examiner

*Primary Examiner*—Eddie Lee  
*Assistant Examiner*—Andrew O. Arena  
(74) *Attorney, Agent, or Firm*—Gibb I.P. Law Firm, LLC; William D. Sabo, Esq.

(57) ABSTRACT

A field effect transistor (FET) comprising an isolation layer, a source region positioned over the isolation layer, a drain region positioned over the isolation layer, a bifurcated silicide gate region positioned over the channel region, and a gate oxide layer adjacent to the gate region, wherein the gate oxide layer comprises an alkali metal ion implanted at a dosage calculated based on threshold voltage test data provided by a post silicide electrical test conducted on said FET, wherein the alkali metal ion comprises any of cesium and rubidium.

21 Claims, 6 Drawing Sheets

METHOD AND STRUCTURE FOR PROVIDING TUNED LEAKAGE CURRENT IN CMOS INTEGRATED CIRCUIT

BACKGROUND OF INVENTION

1. Field of the Invention

The invention generally relates to microelectronic devices, and more particularly to controlling the leakage current in complimentary metal oxide semiconductors (CMOS) integrated circuits.

2. Description of the Related Art

Leakage current occurs in a transistor as the gate's performance declines in terms of its capability to control the flow of electric charge carriers in the channel between the source and drain of the device. Thus, even when the transistor is off, electric charge carriers continue to flow through the channel. In fact, a majority of the power consumed by an inactive transistor is a result of the leakage current.

Prior approaches in the field of leakage current control have suggested the use of active N-well and P-well biasing to adjunct individual chip threshold voltages ($V_t$) in order to tighten the leakage distribution and therefore improve yield as limited by the total power. With scaling, however, well biasing has become less effective and hence other approaches have been suggested, including using a double-gate CMOS having a second gate as a means of adjusting $V_t$. Unfortunately, the use of double-gate field effect transistors (FET) in the split-gate mode degrades their performance potential significantly due to the decreased drive with one gate and degraded sub-threshold turn-off behavior, requiring a higher $V_t$ than the true double gate case.

FinFET devices have been used to reduce a transistor's leakage current by incorporating several gates rather than one to aid in controlling the flow of electric charge carriers in the device. Moreover, one solution to solve this problem is to use a dual gate structure with a n-type gate on one side of a channel and a p-type gate on the other, which aims to properly achieve the correct threshold voltage levels, which is the necessary gate voltage required to turn the transistor on (switch on).

Unfortunately, the leakage power, primarily due to sub-threshold channel currents, has become approximately equal to the switching power in high-performance integrated circuits. In fact, the leakage power varies, typically more than a decade, with the threshold voltage, $V_t$, variation driving the sub-threshold current variation. Therefore, there remains a need for a novel method and structure, which provides superior tuned leakage current control in a transistor device, such as a CMOS device.

SUMMARY OF INVENTION

In view of the foregoing, an embodiment of the invention provides a field effect transistor comprising an isolation layer, a source region positioned over the isolation layer, a drain region positioned over the isolation layer, a bifurcated silicide gate region positioned over the channel region, and a gate oxide layer adjacent to the gate region, wherein the gate oxide layer comprises an alkali metal ion, wherein the alkali metal ion comprises any of cesium and rubidium. According to an aspect of the invention, the transistor comprises a CMOS device comprising any of a nFET configuration and a pFET configuration, wherein ion implantation levels of approximately $3 \times 10^{18}$ cm$^{-3}$ are employed, wherein the alkali metal ion adjusts nFET and pFET threshold voltages for the nFET and pFET configurations by an amount required to match desired off-currents for the nFET and pFET configurations. According to another embodiment, the invention provides a CMOS device comprising an isolation layer over a substrate, raised source/drain regions positioned over the isolation layer, at least one fin structure disposed between the source and drain regions, a gate region positioned over the channel region, a silicon layer dividing the gate region, and a gate oxide layer adjacent to the gate region, wherein the gate oxide layer comprises an alkali metal ion, wherein the alkali metal ion comprises any of cesium and rubidium. According to an aspect of the invention, the device further comprises spacers separating the gate region from the source/drain regions.

Another embodiment of the invention provides a method of tuning a threshold voltage of nFET and pFET devices in a double-gate CMOS integrated circuit structure, wherein the method comprises performing a PSP (post silicide probe) electrical test on the double-gate CMOS integrated circuit structure, determining nFET and pFET threshold voltages during the PSP electrical test, and implanting the double-gate CMOS integrated circuit structure with an alkali metal ion, wherein the step of implanting adjusts the nFET and pFET threshold voltages by an amount required to match desired off-currents for the nFET and pFET devices. According to the method, prior to the step of performing, the method comprises forming a fin structure over a isolation layer, forming source/drain regions over the fin structure, depositing a gate oxide layer adjacent to the source/drain regions, and forming a gate region over the gate oxide layer and the fin structure. Additionally, the alkali metal ion comprises any of cesium and rubidium. Moreover, the ion implantation levels are determined during the PSP test, wherein ion implantation levels are approximately $3 \times 10^{18}$ cm$^{-3}$.

Using the inventive concepts provided by the invention, integrated circuit dies may be fabricated with greater precision in threshold voltage than was previously attainable. Other advantages provided by the invention include improved circuit performance, reduced leakage power, and operation at reduced power-supply voltage. Furthermore, fabrication yield can be improved as a result of improved control of threshold voltages, and circuits which require precise differences in threshold voltages may be fabricated.

These and other aspects of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the invention without departing from the spirit thereof, and the invention includes all such modifications.

BRIEF DESCRIPTION OF DRAWINGS

The invention will be better understood from the following detailed description with reference to the drawings, in which.

DETAILED DESCRIPTION

The invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the invention. The examples used herein are intended merely to facilitate an understanding of ways in which the invention may be practiced and to further enable those of skill in the art to practice the invention. Accordingly, the examples should not be construed as limiting the scope of the invention.

As mentioned, there remains a need for a novel method and structure, which provides superior tuned leakage current control in a transistor device, such as a CMOS device. In order to address this need, an embodiment of the invention provides a cesium implantation in a double-gate FinFET device (or other double-gate devices) in a double-gate mode (e.g. both gate electrodes are tied to each other and are used as a single gate) while still realizing the benefits of tightly-controlled chip leakage variation. Referring now to the drawings, and more particularly to FIGS. 1 through 12(b), there are shown preferred embodiments of the invention.

Figure 1:
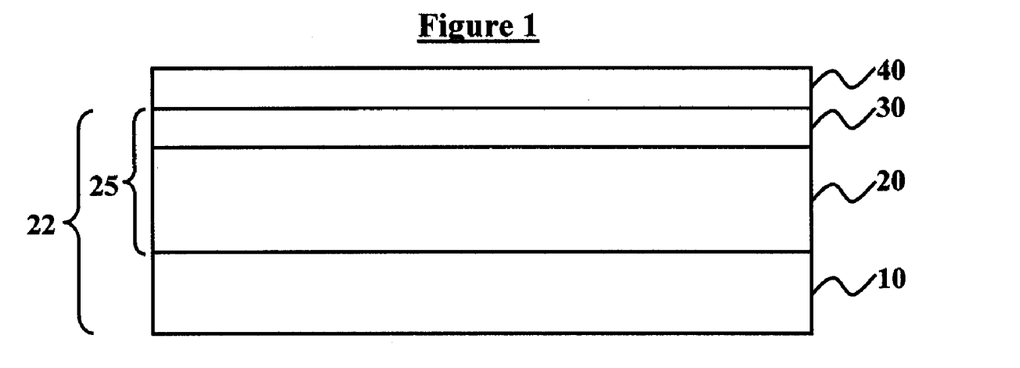
FIG. 1 is a schematic diagram of a CMOS device during a first intermediate processing step according to an embodiment of the invention.
Figure 2:
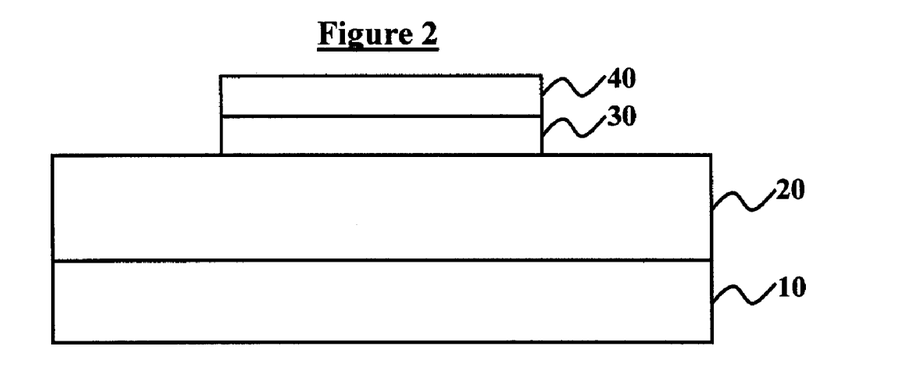
FIG. 2 is a schematic diagram of a CMOS device during a second intermediate processing step according to an embodiment of the invention.

A CMOS device according to the invention is illustrated in the generally sequential fabrication steps illustrated in FIGS. 1 through 8. As shown in FIG. 1, a $SiO_2/Si_3N_4$ hardmask layer 40 is sequentially deposited on a silicon-on-insulator (SOI) wafer 22. The SOI wafer 22 comprises a substrate 10 and a Buried Oxide (BOX) layer 25, which in the preferred embodiment, comprises the isolation layer 20, and a silicon layer 30, and is typically fabricated by means well known by those versed in the state of the art (e.g. Bond and Etch Back SOI, or Separation by Implantation of Oxygen). Next, as illustrated in FIG. 2, portions of the silicon layer 30 and hardmask layer 40 are etched using any well-known etching technique to configure the silicon layer 30 and hardmask layer 40 into a preferred fin configuration, thereby exposing portions of the underlying isolation layer 20.

Preferably, the silicon layer 30 is configured to be approximately 10 nm in width and 50 nm in thickness, wherein the thickness configurations shall eventually determine the transistor body height as well as the fin height in the device. The oxide/nitride hardmask layer 40 may be deposited over the silicon layer 30 using any well-known deposition technique, and preferably by chemical vapor deposition (CVD).

Figure 3:
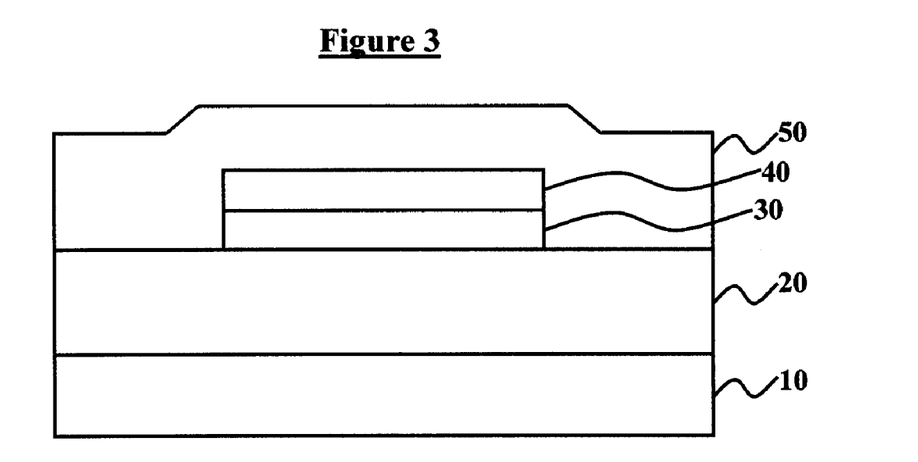
FIG. 3 is a schematic diagram of a CMOS device during a third intermediate processing step according to an embodiment of the invention.
Figure 4:
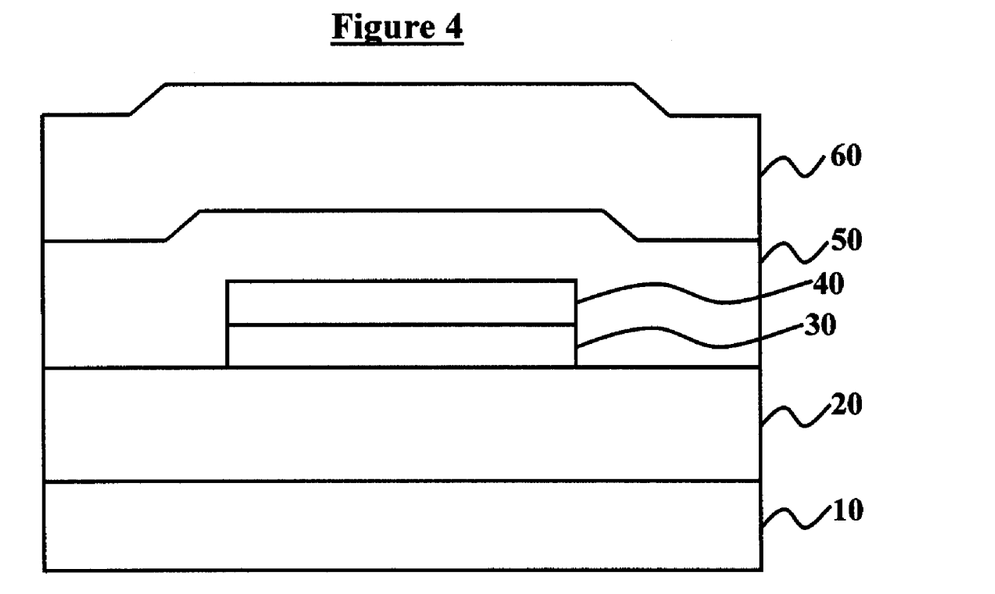
FIG. 4 is a schematic diagram of a CMOS device during a fourth intermediate processing step according to an embodiment of the invention.

Next, as shown in FIG. 3, a phosphorous doped polysilicon/germanium layer 50 is deposited over the device, and specifically, over the hardmask layer 40 and the exposed isolation layer 20. Furthermore, the polysilicon/germanium layer 50 makes contact with the sides of the silicon layer 30 and hardmask layer 40. Thereafter, an oxide layer 60 preferably comprising $SiO_2$ is CVD deposited over the polysilicon layer 50, which is depicted in FIG. 4.

Figure 5:
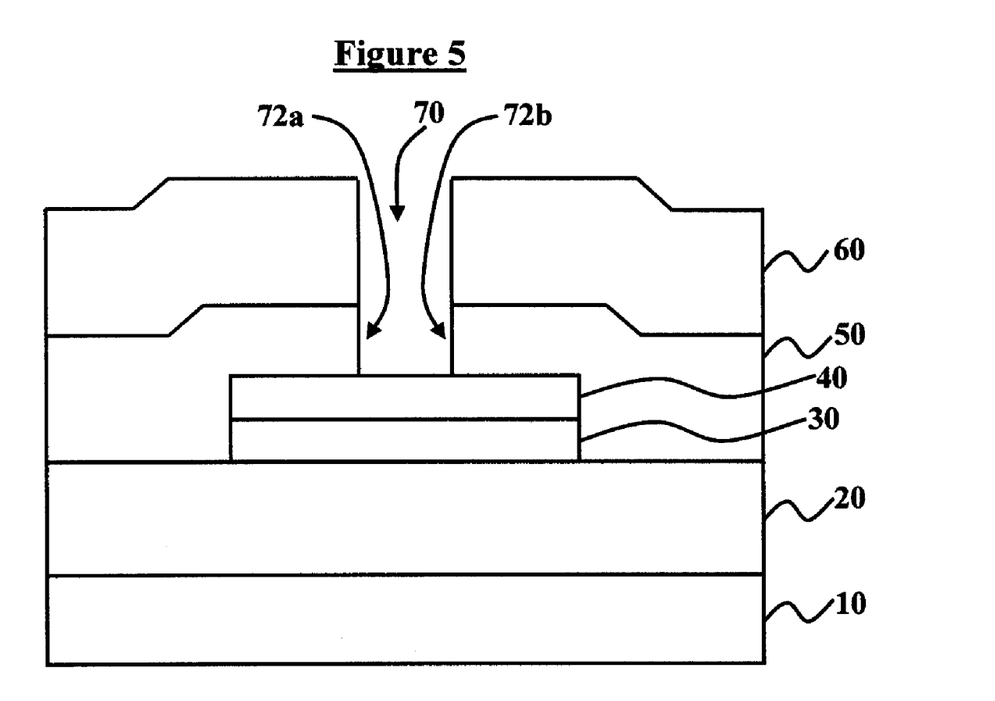
FIG. 5 is a schematic diagram of a CMOS device during a fifth intermediate processing step according to an embodiment of the invention.

Following these steps, the source and drain regions along with the eventual gate region of the device are configured. While a raised source and drain region is illustrated in the various drawings, those skilled in the art would readily understand that other configurations for the source and drain regions may also be used in accordance with the invention. A patterned photolithography mask is deposited over the oxide layer 60, and using well-known etching techniques, such as electron beam lithography, an opening 70 is formed through the oxide layer 60 and polysilicon/germanium layer 50 down to, and exposing the surface of, the oxide/nitride hardmask layer 40. This opening 70, which is approximately 100 nm in width, separates the source and drain regions 72a, 72b from one another. This is best shown in FIG. 5, wherein the oxide/nitride hardmask layer 40 protects the underlying silicon layer 30 from the etching process.

Figure 6:
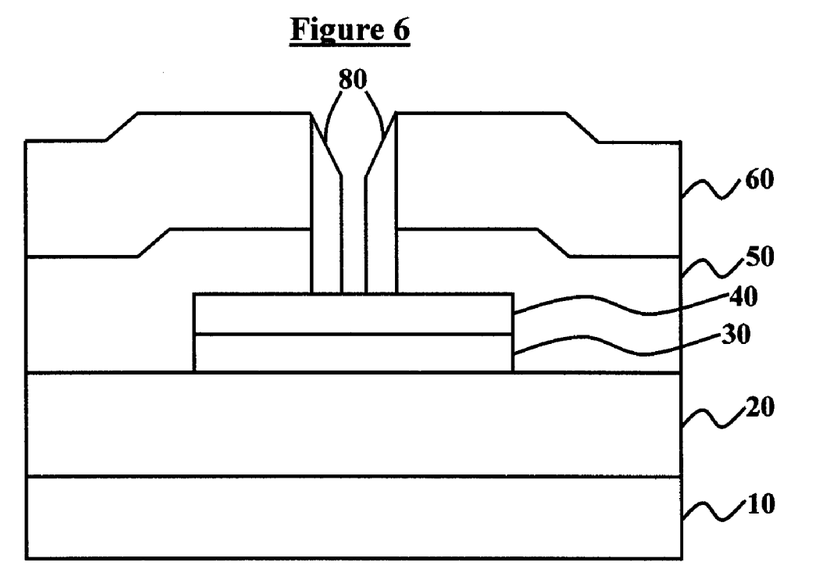
FIG. 6 is a schematic diagram of a CMOS device during a sixth intermediate processing step according to an embodiment of the invention.

Next, as illustrated in FIG. 6, a pair of sidewall spacers 80, which preferably comprise $SiO_2/Si_3N_4$, are formed by CVD deposition within the opening 70 and along the side-walls of the oxide layer 60 and polysilicon layer 50. An opening 70 remains separating the spacers 80 from one another. Moreover, the spacers 80 are configured to extend from the top of the oxide layer 60 to the top of the oxide/nitride hardmask layer 40.

Figure 7:
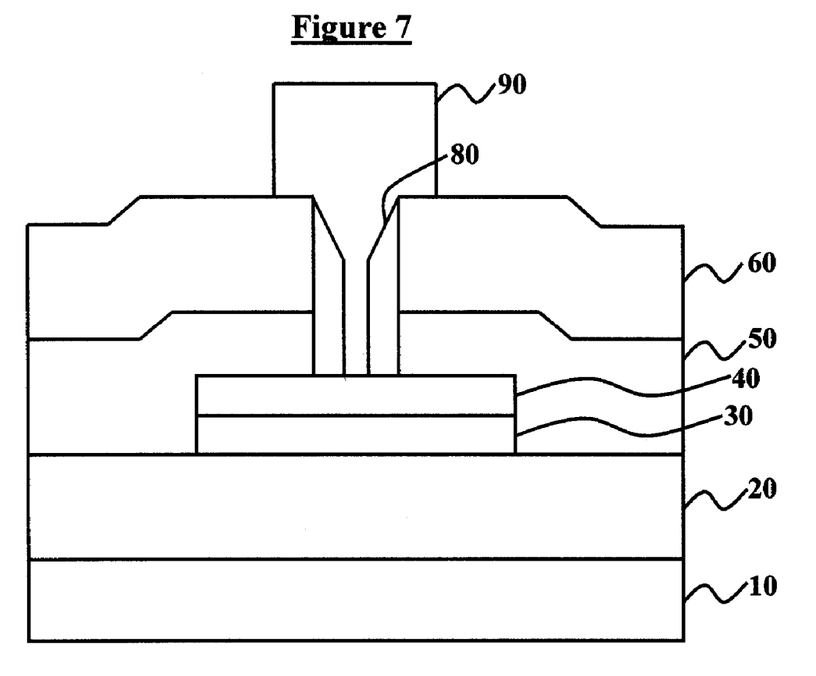
FIG. 7 is a schematic diagram of a CMOS device during a seventh intermediate processing step according to an embodiment of the invention.
Figure 8:
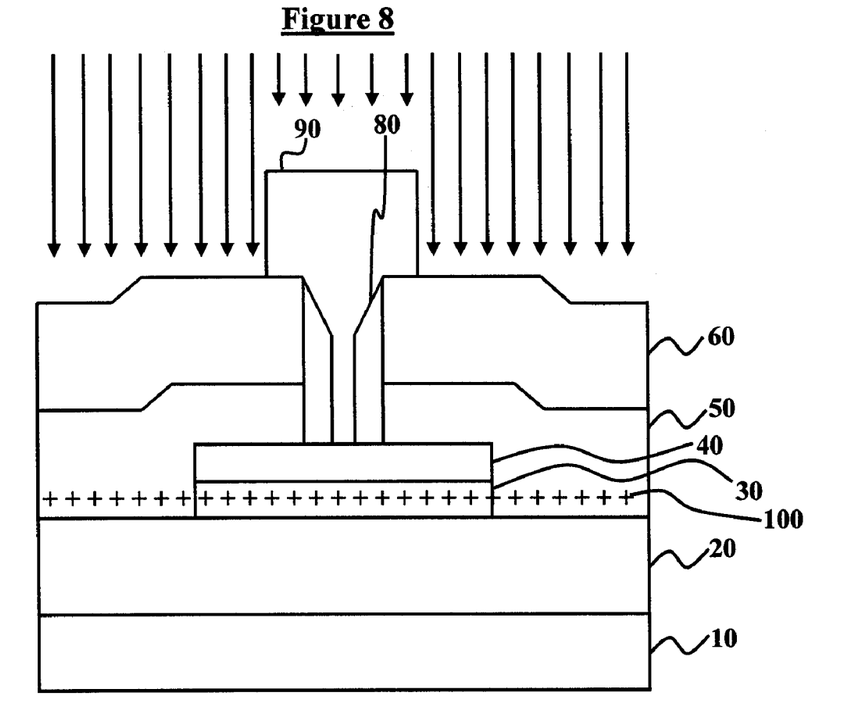
FIG. 8 is a schematic diagram of a completed CMOS device according to an embodiment of the invention.

Upon completion of this step, a gate region 90, preferably comprising SiGe, is formed to fill the opening 70 and to extend above the oxide layer 60, which is illustrated in FIG. 7. Then, as shown in FIG. 8, an ion implantation initially occurs in the oxide layer 60. However, the implantation process is controlled to center the ion implants into the underlying layers below, such as the gate oxide layer 94 (shown in FIGS. 9 and 10), silicon layer 30, and polysilicon/germanium layer 50. This ion implantation, which results in a positive charge in the oxide layer 60, occurs using an element having a low electronegativity of approximately 0.8 eV, a small ionization potential of less than approximately 5 eV, and a small diffusion coefficient in silicon oxide, less than approximately $10^{-20}$ $cm^2/s$ at temperatures used to finish the processing of the wafer (approximately 500° C.) and less than approximately $10^{-25}$ $cm^2/s$ at use temperatures (approximately 100° C.).

Figure 9:
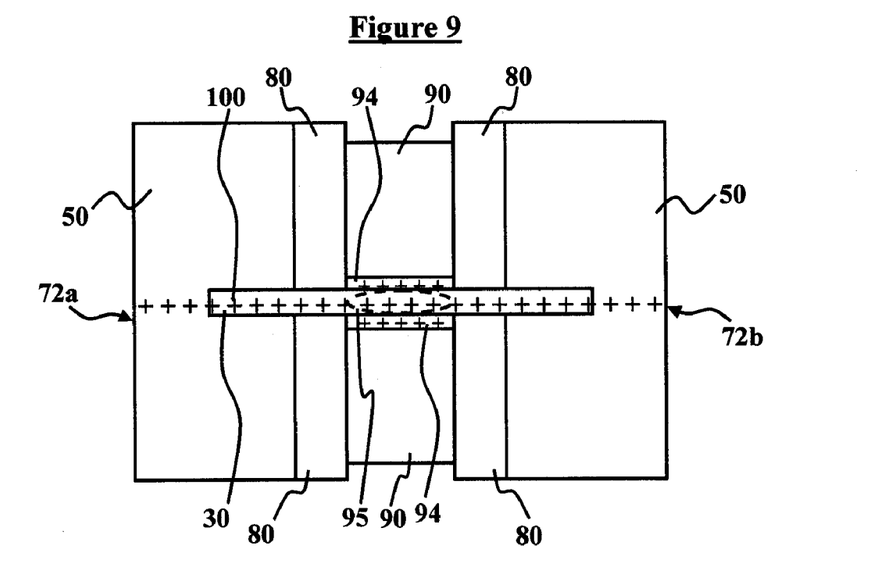
FIG. 9 is a top view of the CMOS device of FIGS. 1 through 8 according to an embodiment of the invention.
Figure 10:
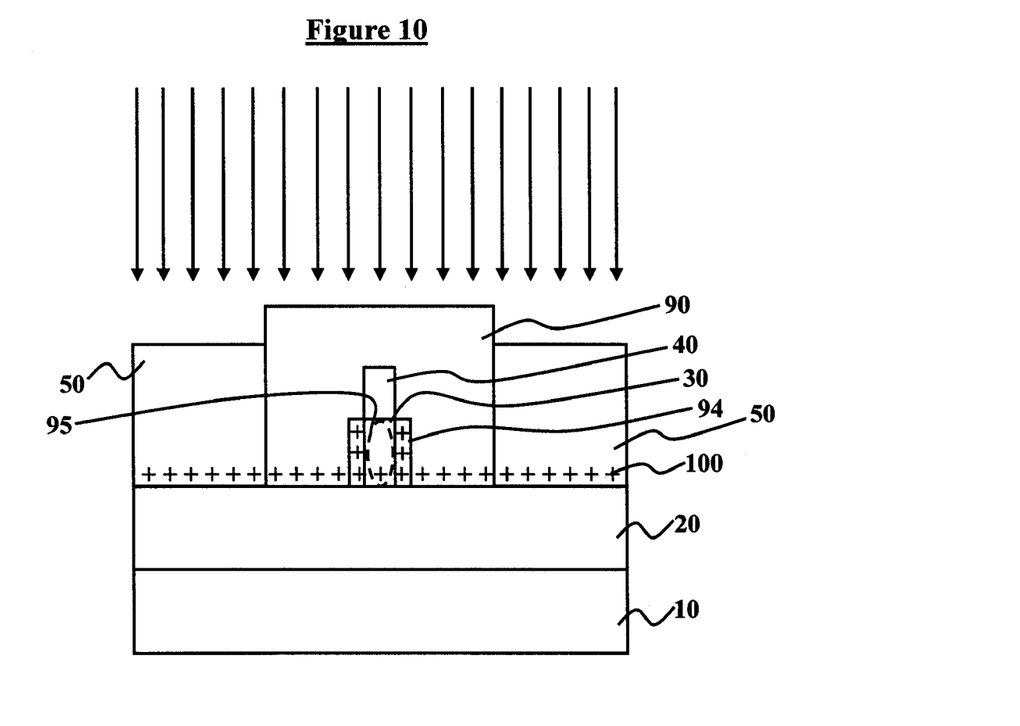
FIG. 10 is side view of the CMOS device of FIG. 9 according to an embodiment of the invention.

Moreover, the gate region 90 is generally positioned over a channel region 95 (the channel region 95 is best shown in FIGS. 9 and 10), although a portion of the gate region 90 fills the gap 70 between the spacers 80. Accordingly, cesium ions are preferable used for this ionization process as cesium is immobile in $SiO_2$ at back end of the line (BEOL) process temperatures. However, other alkali metals such as rubidium may also be used. According to a preferred embodiment of the invention, cesium ions 100 are implanted in such a way as to have a maximum concentration throughout the gate oxide layer 94 (shown in FIGS. 9 and 10). In fact, the implantation may occur in any desired location in the device shown in FIG. 8. However, the cesium ions implanted in the gate oxide layer 94 provide the device with its preferred functionality according to the invention.

A top down view of the FET is illustrated in FIG. 9, which for ease of understanding is shown without the oxide/nitride hardmask layer 40 or the oxide layer 60. Additionally, FIG. 9 illustrates a gate dielectric layer 94, preferably comprising an oxide material (hereinafter referred to as the gate oxide (or gate oxide layer) 94) adjacent to the gate region 90 along with a channel region 95 which constitutes the area on the FET device between the spacers 80, which separate the source and drain regions 72a, 72b from one another. The formation of the gate oxide layer 94 preferably occurs prior to formation of the gate region 90. As illustrated, the cesium ions 100 are shown implanted in both the silicon layer 30 and polysilicon layer 50 as well as in the gate oxide 94.

FIG. 10 illustrates a side view of the FET device of FIG. 9. As shown, the cesium ions 100 are implanted in both the silicon layer 30 and polysilicon layer 50 of the FET device as well as in the gate oxide 94. FIG. 10 further illustrates the channel region 95 between the gate oxide layers 94.

A novel aspect of the invention is the use of the cesium ion implant 100 post silicide electrical test in order to tune the threshold voltage, $V_t$. As such, the invention centers both the nFET and pFET threshold voltages, $V_t$, which are slightly too positive (for the desired application) at the PSP electrical test. In particular, those processes which are responsible for determining the $V_t$ (at the point that silicide processing is completed) are engineered to result in a nominal $V_t$ for both nFET and pFET configurations, which is more positive than the final desired $V_t$s ($V_{tf}$) when the BEOL processing is complete. For example, if the tolerance of the $V_t$ is given by $dV_t$, then the process is designed (e.g. by choice of halo ion-implant doses and energies) to yield a threshold voltage of $V_{tf}+dV_t$. When a given wafer is fabricated and tested at PSP, a particular value of $V_t$ is measured and will have some particular offset, $V_{toff}$, above the final target $V_{tf}$. A cesium ion dose normal to the channel surface is ten calculated for each type of FET, using $N_{Cs}=2C_{ox} \times V_{toff}/Qe$, where $C_{ox}$ is the capacitance per unit area of the gate electrode to the channel, and Qe is the unit electronic charge (approximately $1.6 \times 10^{-19}$ C). The dose of ions actually ion-implanted must be adjusted to account for the geometry of the structure. For instance, when ion-implantation is normal to the wafer surface and the FinFET presents a channel which is normal to the wafer, then the implanted dose must be a factor of the fin height divided by the gate oxide thickness times the calculated normal dose.

Moreover, ion implantation of the n and p regions separately with cesium is used to shift the threshold voltages, $V_t$, in a negative direction by an amount required to match the desired off-currents for nFETs and pFETs. This dose is calculated for each wafer based on the PSP test data. Low temperature annealing (300° C.) will activate the cesium ions in the oxide layer 60, and will not disturb the CMOS process otherwise. The cesium ion implantation concentration is approximately $3 \times 10^{18}$ cm$^{-3}$, and preferably between 0 and $4 \times 10^{18}$ cm$^{-3}$, depending on the amount of $V_t$ adjustment needed and the thickness of the gate oxide 94. This generally completes the front-end of the line processing of the CMOS device according to an embodiment of the invention. Subsequent BEOL processing involves forming metal contacts (not shown) in the CMOS device. Typical hot-process-related $V_t$ tolerances may be +/−50 mV which for a gate oxide thickness in the range of 1 to 3 nm can require ion doses of approximately $3 \times 10^{18}$ cm$^{-3}$, and preferably in the range of 0 to $4 \times 10^{18}$ cm$^{-3}$, depending on the exact value of $V_{toff}$ to be compensated.

Figure 11:
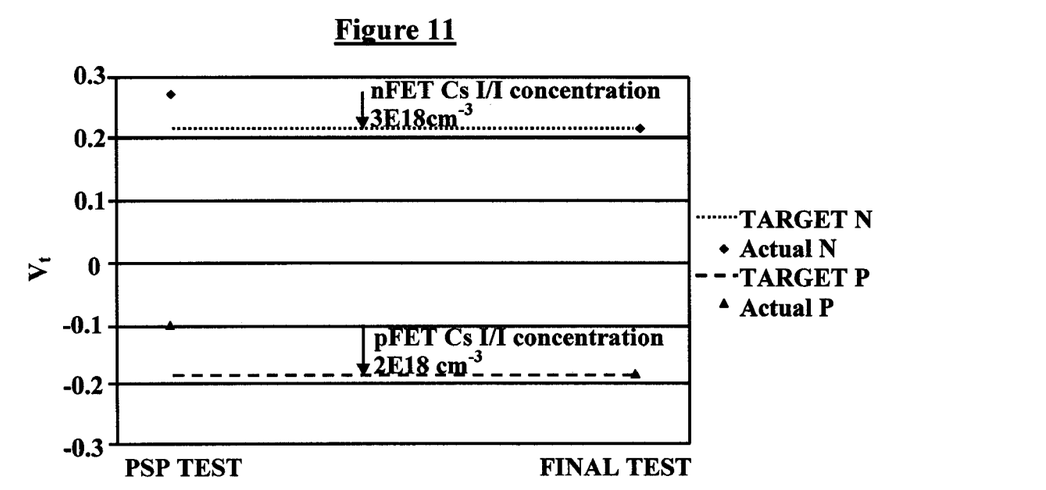
FIG. 11 is a graphical illustration of voltage results for a CMOS device according to an embodiment of the invention.

FIG. 11 shows a diagram illustrating positive and negative threshold voltage values for nFETs and pFETs, respectively. As an example, measured values of 280 mV and −100 mV are indicated by the "diamond" and "triangle" symbols for nFET and pFET $V_t$s, respectively, as measured at PSP test. Lines at 220 mV and −190 mV indicate target $V_t$s for nFETs and pFETs respectively. As such, cesium ion implant doses normal to the channel surfaces of $2.5 \times 10^{12}$ cm$^{-2}$ and $3.75 \times 10^{12}$ cm$^{-2}$ are required to adjust the $V_t$s of the nFETs and pFETs by −60 mV and −90 mV, respectively. Because the ion implantation is typically normal to the wafer surfaces, and not the channel surfaces, as shown in FIG. 10, the actual doses used will be increased by a factor given by the height of the fin divided by the gate oxide thickness. Thus, for fins that are 50 nm in height and a $T_{ox}$ of 2 nm, the doses would correspond to approximately $6.25 \times 10^{13}$ cm$^{-2}$ and $9.38 \times 10^{13}$ cm$^{-2}$ as required to adjust the $V_t$s of the nFETs and pFETs, respectively. Additionally, planar FETs could also be employed in this technique, including both single-gate and double-gate configurations. In the planar cases, the cesium doses would be as given for the net (normal to the channel surfaces) ion implant doses.

According to the invention, the PSP test comprises contacting the source 72a, drain 72b, gate 90 and body (if not an SOI device) (not shown) with electrical probes after either source and drain formation is complete or after the formation of a silicide on the sources 72a and drains 72b. It is advantageous to perform an annealing process in hydrogen gas, typically for twenty minutes at approximately 400° C., to minimize surface states in the channel region 95. The threshold voltage is measure by any standard technique, such as finding the gate bias at which a particular source current is achieved. For nFETs, typically a drain-to-source voltage ($V_{ds}$) of 50 mV is applied and the gate voltage is raised to a level where a current in the source is approximately 300 nA×W/L (where W and L are the width and length of the FET under test) is achieved, wherein this value of gate voltage being defined as the threshold voltage. For pFETs the procedure is the same except that $V_{ds}$ of −50 mV is typically used and a current of approximately 70 nA×W/L is used to define $V_t$.

The invention also provides use of the above-described techniques to fine tune differences in $V_t$ for various types of FETs. For instance, a particular circuit may perform its function best when a special high $V_t$ FET has a threshold voltage that is, for example, 70 mV and higher than that of the standard $V_t$ FET. To assure that this offset in $V_t$ is attained, PSP testing of these two types of FETs can be used to ascertain the difference in $V_t$s of the FET types, and a cesium ion dose chosen for one of the two types of FETs to trim the $V_t$ difference much or accurately to the 70 mV value required in this example. Similarly, pFET and nFET leakages can be more accurately matched with a similar methodology in order to minimize the overall die leakage for a give circuit speed.

Figure 12A:
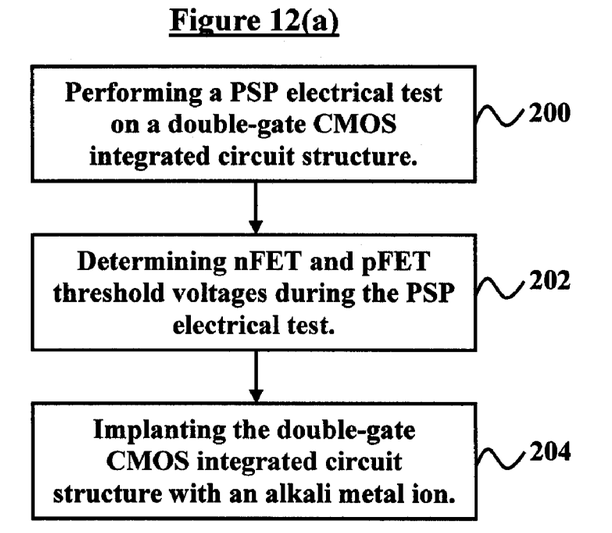
FIG. 12(a) is a flow diagram illustrating a first preferred method of the invention.

FIG. 12(a) illustrates a method of tuning a threshold voltage of nFET and pFET devices in a double-gate CMOS integrated circuit structure, wherein the method comprises performing 200 a PSP electrical test on the double-gate CMOS integrated circuit structure, determining 202 nFET and pFET threshold voltages during the PSP electrical test, and implanting 204 the double-gate CMOS integrated circuit structure with an alkali metal ion 100, wherein the step of implanting adjusts the nFET and pFET threshold voltages by an amount required to match desired off-currents for the nFET and pFET devices.

Figure 12B:
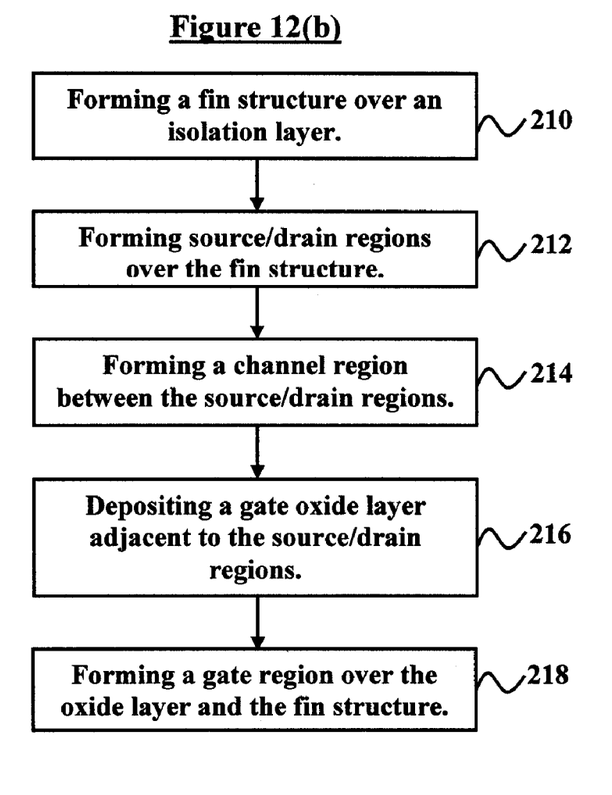
FIG. 12(b) is a flow diagram illustrating a second preferred method of the invention.

As shown in FIG. 12(b), according to the method, prior to the step of performing 200, the method comprises forming 210 a fin structure 30 over an isolation layer 20, forming 212 source/drain regions 72a, 72b over the fin structure 30, forming 214 a channel region 95 between the source/drain regions 72a, 72b, depositing 216 a gate oxide layer 94 adjacent to the source/drain regions 72a, 72b, and forming 218 a gate region 90 over the gate oxide layer 94 and the fin structure 30. Additionally, the alkali metal ion 100 comprises any of cesium and rubidium. Moreover, the ion implantation levels are determined during the PSP test, wherein ion implantation concentrations of approximately $2 \times 10^{18}$ cm$^{-3}$ are employed.

Generally, the invention provides a cesium implantation in a double-gate device (or other double-gate devices) in a double-gate mode (e.g. both gate electrodes are tied to each other and are used as a single gate) while still realizing the benefits of tightly-controlled chip leakage variation. Furthermore, while the invention has been described in terms of double-gate device, it can be equally applied to multiple-gate FETs, such as Trigate FETs, or single-gate FETs, such as Fully-depleted SOI or other planar transistors. Using the inventive concepts provided by the invention, integrated circuit die may be fabricated with greater precision in threshold voltage than was previously attainable. Other advantages provided by the invention include improved circuit performance, reduced leakage power, and operation at reduced power-supply voltage. Furthermore, fabrication yield can be improved as a result of improved control of threshold voltages, and circuits which require precise differences in threshold voltages may be fabricated.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of preferred embodiments, those skilled in the art will recognize that the invention can be practiced with modification within the spirit and scope of the appended claims.

The invention claimed is:

1. A field effect transistor (FET) comprising:
    a source region;
    a drain region;
    a channel region disposed between the source and drain regions;
    a bifurcated gate region positioned over said channel region; and
    a gate oxide layer adjacent to said gate region, wherein said gate oxide layer comprises an alkali metal ion implanted at a dosage calculated based on threshold voltage test data provided by a post silicide electrical test conducted on said FET, and wherein each of said source and drain regions comprise a semiconductor layer comprising said alkali metal ion.

2. The transistor of claim 1, further comprising:
    a substrate;
    an isolation layer positioned over said substrate; and
    at least one fin structure disposed between the source and drain regions;
    wherein said source and drain regions are positioned over said isolation layer.

3. The transistor of claim 1, wherein said alkali metal ion comprises any of cesium and rubidium.

4. The transistor of claim 1, wherein said transistor is one of a plurality of transistors comprised by a CMOS (complementary metal oxide semiconductor) device.

5. The transistor of claim 4, wherein said plurality of transistors comprises any of a nFET device and a pFET device.

6. The transistor of claim 1, wherein an ion implantation level of said alkali metal ion is approximately $3 \times 10^{18}$ cm$^{-3}$.

7. The transistor of claim 1, wherein said gate region comprises silicide.

8. The transistor of claim 5, wherein said alkali metal ion adjusts nFET and pFET threshold voltages for the nFET and pFET devices by an amount required to match desired off-currents for said nFET and pFET devices.

9. A CMOS (complementary metal oxide semiconductor) device comprising:
    raised source and drain regions;
    a channel region disposed between said source and drain regions;
    a gate region positioned over said channel region;
    a silicon layer dividing said gate region; and
    a gate oxide layer adjacent to said gate region, wherein said gate oxide layer comprises an alkali metal ion implanted at a dosage calculated based on threshold voltage test data provided by a post silicide electrical test conducted on said CMOS device, and wherein each of said source and drain regions comprise a semiconductor layer comprising said alkali metal ion.

10. The device of claim 9, further comprising:
    a substrate;
    an isolation layer positioned over said substrate; and
    at least one fin structure disposed between said source and drain regions;
    wherein said source and drain regions are positioned over said isolation layer.

11. The device of claim 9, wherein said alkali metal ion comprises any of cesium and rubidium.

12. The device of claim 9, further comprising a plurality of FET (field effect transistor) devices, wherein said plurality of FET devices comprises any of a nFET device and a pFET device.

13. The device of claim 9, wherein an ion implantation level of said alkali metal ion is approximately $3 \times 10^{18}$ cm$^{-3}$.

14. The device of claim 9, further comprising spacers separating said gate region from said source and drain regions.

15. The device of claim 9, wherein said gate region comprises silicide.

16. The device of claim 12, wherein said alkali metal ion adjusts nFET and pFET threshold voltages for the nFET and pFET devices by an amount required to match desired off-currents for said nFET and pFET devices.

17. The transistor of claim 1, further comprising spacers separating said gate region from said source and drain regions.

18. The transistor of claim 2, wherein said dosage of the alkali metal ion implantation is a function of a height of said fin structure divided by a thickness of said gate oxide multiplied by a calculated dosage level of said alkali metal ion implanted in a direction normal to said channel region.

19. The transistor of claim 1, further comprising a silicide on said source and drain regions.

20. The device of claim 10, wherein said dosage of the alkali metal ion implantation is a function of a height of said fin structure divided by a thickness of said gate oxide multiplied by a calculated dosage level of said alkali metal ion implanted in a direction normal to said channel region.

21. The device of claim 9, further comprising a silicide on said source and drain regions.

* * * * *